United States Patent
Zhao et al.

(10) Patent No.: US 10,720,463 B2
(45) Date of Patent: Jul. 21, 2020

(54) BACKSIDE ILLUMINATED IMAGE SENSOR WITH THREE-DIMENSIONAL TRANSISTOR STRUCTURE AND FORMING METHOD THEREOF

(71) Applicant: GALAXYCORE SHANGHAI LIMITED CORPORATION, Shanghai (CN)

(72) Inventors: Lixin Zhao, Shanghai (CN); Wenqiang Li, Shanghai (CN); Yonggang Wang, Shanghai (CN); Jie Li, Shanghai (CN)

(73) Assignee: GALAXYCORE SHANGHAI LIMITED CORPORATION, Shanghai (CN)

(*) Notice: Subject to any disclaimer, the term of this patent is extended or adjusted under 35 U.S.C. 154(b) by 314 days.

(21) Appl. No.: 15/752,212

(22) PCT Filed: Apr. 7, 2016

(86) PCT No.: PCT/CN2016/078738
§ 371 (c)(1),
(2) Date: Feb. 12, 2018

(87) PCT Pub. No.: WO2017/028546
PCT Pub. Date: Feb. 23, 2017

(65) Prior Publication Data
US 2020/0135777 A1   Apr. 30, 2020

(30) Foreign Application Priority Data
Aug. 18, 2015  (CN) .......................... 2015 1 0505877

(51) Int. Cl.
*H01L 27/146*  (2006.01)
*H01L 29/768*  (2006.01)

(52) U.S. Cl.
CPC ...... *H01L 27/1464* (2013.01); *H01L 27/1463* (2013.01); *H01L 27/14614* (2013.01); *H01L 27/14689* (2013.01); *H01L 29/76883* (2013.01)

(58) Field of Classification Search
CPC .......... H01L 29/76883; H01L 27/1464; H01L 27/14689
(Continued)

(56) References Cited

U.S. PATENT DOCUMENTS 7,364,960 B2 * 4/2008 Lyu ................... H01L 27/14603
                                                             257/E21.17
8,193,057 B2    6/2012 Kang
(Continued)

FOREIGN PATENT DOCUMENTS

CN    101030602 A    9/2007
CN    102130171 A    7/2011
(Continued)

OTHER PUBLICATIONS

PCT International Search Report, PCT/CN2016/078738, dated Jul. 13, 2016, 6 Pages.

*Primary Examiner* — David Vu
*Assistant Examiner* — Brandon C Fox
(74) *Attorney, Agent, or Firm* — Fenwick & West LLP

(57) ABSTRACT

A method for forming a backside illuminated image sensor with a three-dimensional transistor structure is provided, where forming a gate of the three-dimensional transistor structure includes: forming a source follower transistor and/or a reset transistor with a three-dimensional transistor structure, wherein the source follower transistor and/or the reset transistor correspond to a protruding structure; and forming an insulating sidewall around the protruding structure, forming a groove between the insulating sidewall and
(Continued)

a channel region of a transistor corresponding to the protruding structure, and forming a gate of the transistor in the groove, wherein the gate of the transistor is isolated by the insulating sidewall.

8 Claims, 4 Drawing Sheets

(58) Field of Classification Search
USPC .......................................................... 257/292
See application file for complete search history.

(56) References Cited

U.S. PATENT DOCUMENTS

| | | | |
|---|---|---|---|
| 8,247,256 B2 * | 8/2012 | Ho | H01L 27/14603 438/400 |
| 8,937,349 B2 | 1/2015 | Amari | |
| 2002/0003256 A1 * | 1/2002 | Maegawa | H01L 29/42384 257/328 |
| 2007/0108514 A1 | 5/2007 | Inoue et al. | |
| 2008/0210992 A1 * | 9/2008 | Kim | H01L 27/14609 257/292 |
| 2008/0246087 A1 | 10/2008 | Kang | |
| 2011/0059588 A1 | 3/2011 | Kang | |
| 2011/0156136 A1 | 6/2011 | Amari | |
| 2014/0252420 A1 * | 9/2014 | Yi | H01L 27/14614 257/229 |
| 2015/0102402 A1 | 4/2015 | Amari | |
| 2016/0056201 A1 * | 2/2016 | Yamashita | H01L 27/14609 257/292 |

FOREIGN PATENT DOCUMENTS

| | | |
|---|---|---|
| CN | 104022036 A | 9/2014 |
| CN | 105185799 A | 12/2015 |

* cited by examiner

BACKSIDE ILLUMINATED IMAGE SENSOR WITH THREE-DIMENSIONAL TRANSISTOR STRUCTURE AND FORMING METHOD THEREOF

CROSS-REFERENCE TO RELATED APPLICATIONS

This application claims the benefit of priority to Chinese Patent Application No. 201510505877.0, filed on Aug. 18, 2015, and entitled "BACKSIDE ILLUMINATED IMAGE SENSOR WITH THREE-DIMENSIONAL TRANSISTOR STRUCTURE AND FORMING METHOD THEREOF," the entire disclosure of which is incorporated herein by reference.

TECHNICAL FIELD

The present disclosure generally relates to image sensor field, and more particularly, to a backside illuminated image sensor with a three-dimensional transistor structure and a forming method thereof.

BACKGROUND

An image sensor is a semiconductor device converting an optical signal into an electric signal and provided with a photoelectric conversion element.

Image sensors can be classified into Complementary Metal Oxide Semiconductor (CMOS) image sensors and Charge Coupled Device (CCD) image sensors. The CCD image sensors have the advantages of high image sensitivity and low noise, while they are difficult to be integrated with other devices. Besides, power consumption of the CCD image sensors is relatively high. The CMOS image sensors have the advantages of being simple in process and easy to be integrated with other devices, small in size, light in weight, low in power consumption, low in cost and the like. Therefore, with the development of technology, the CMOS image sensors have replaced the CCD image sensors more and more to be applied in various electronic products. At present, the CMOS image sensors are widely applied in static digital cameras, camera phones, digital video cameras, medical photographing devices (such as a gastroscope), vehicular photographing devices and the like.

A core element of an image sensor is pixels which directly affect a size of the image sensor, a dark current level, a noise level, imaging permeability, image color saturation, image defects and the like.

A pair of contradictory factors always pushes image sensors to develop gradually.

The first factor is an economic factor. More image sensor chips a wafer can produce, the lower the cost of the image sensor chip is. As pixels occupy most of the area of the whole image sensor chip, a size of each pixel is required to be relatively small to save the cost. That is, the size of the pixel in the image sensor is required to be reduced for the economic factor.

The second factor is an image quality factor. To ensure image quality, especially to ensure indexes such as light sensitivity, color saturation or imaging permeability, enough light is required to be emitted to a photoelectric conversion element (usually a photodiode is employed) of the pixel. A larger pixel can have a larger light-sensitive area to accept light, thus, a relatively large pixel unit can provide better image quality. In addition, besides the photoelectric conversion element in the pixel, considerable switching devices in the pixel, such as a reset transistor, a transmission transistor or an amplifier device (for example, a source follower transistor), also determine a dark current, a noise, image defects and the like. From quality of images, a larger device possesses better electric performance, and is prone to form images with better quality. Therefore, the size of the pixel in the image sensor is required to be increased for the image quality factor.

It can be seen that how to coordinate the contradiction above to achieve an optimal selection is a problem the image sensor industry always faces.

An existing image sensor always includes a pixel array consisting of a plurality of pixels. From the layout, the plurality of pixels can be spliced together to form a complete pixel array, and a shape of the pixels may be rectangular, square, polygonal (triangular, pentagonal, hexagonal) and the like according to requirements.

In the existing image sensor, structures of the pixels can be classified into a photoelectric conversion element with a three-transistor structure, a photoelectric conversion element with a four-transistor structure and a photoelectric conversion element with a five-transistor structure. With the photoelectric conversion element with the three-transistor structure, the photoelectric conversion element is directly electrically connected with a floating diffusion region, photo-generated electrons generated in the photoelectric conversion element are stored in the floating diffusion region, and the photo-generated electrons are converted and output through a source follower (SF) under sequential control of a Reset Transistor (RST) and a row selector (SEL) transistor.

Referring to FIG. 1, FIG. 1 schematically illustrates a cross-sectional view of a photoelectric conversion element with a four-transistor structure. A photoelectric conversion element 115 is usually a Photo diode (PD) electrically connected with a Floating Diffusion (FD) region 113 through a transfer transistor 114. A lead wire L3 (usually including a plug, interconnecting wires and the like) is electrically connected with a gate of the transfer transistor 114. A source follower transistor 112 is electrically connected with the floating diffusion region 113, and is configured to amplify a potential signal formed in the floating diffusion region 113. The lead wire L2 is electrically connected with the gate of the source follower (amplification) transistor 112. One terminal of the reset transistor 111 is electrically connected with a power supply VDD, another terminal of the reset transistor 111 is electrically connected with the floating diffusion region 113 to reset the potential of the floating diffusion region 113, and the gate of the reset transistor 111 is electrically connected with the lead wire L1. As can be seen from the above, the photoelectric conversion element with the four-transistor structure includes the transmission transistor 114 formed between the photoelectric conversion element 115 and the floating diffusion region 113 on the basis of a photoelectric conversion element with a three-transistor structure. The transmission transistor 114 can effectively inhibit noise. As a result, the photoelectric conversion element and the four-transistor structure may lead to better image quality and has become a leading structure in the industry. In addition, a set of four-transistor devices can be shared by a plurality of photoelectric conversion elements, so as to save a chip area, which structure is also considered as a four-transistor structure.

However, in the existing image sensor, the pixels have defects that are difficult to overcome.

First, in the existing pixel, four transistors are all planar structures. In other words, if the chip area needs to be further reduced, a size of these devices (such as the transmission transistor, the reset transistor and the source follower transistor) must be reduced. However, if the size of these devices is reduced, performance of these devices may be reduced accordingly. For example, a driving current of the device may be reduced, an electric parameter fluctuation is increased, and amplification efficiency may be reduced. These problems are quite serious for the quality of images. Therefore, although circuits at the periphery of the pixel array can further reduce line width according to the Moore law to reduce size, the size of the transistors in the pixel can only be reduced very slowly. However, the area of the whole image sensor chip is mainly determined by the pixel array, and therefore, the structure of the existing pixels limits the further reduction of the chip area, so that the cost of the existing image sensor is relatively high.

Second, in the existing pixel, four transistors are all planar structures. For a pixel with a certain size, the size can hardly be further reduced after the four transistors are accommodated, which limits a proportion of the photoelectric conversion element of a light sensing part to the pixel. For performance of the pixel, the smaller the proportion of the photoelectric conversion element to the pixel is, the less the light can be collected in a unit area, the less transparent the image is, the poorer gradation the image has, and the drier the color is. In summary, the planar structures of the transistors limit the further improvement of the image quality.

Third, in the existing pixel unit, the image quality under a dark field is quite essential. Key indexes for the image quality include a dark current, noise, white spots, dark spots and etc. The dark current, the noise, the white spots and the dark spots are derived from frequency noise and thermal noise of the transistors, and a surface composite current of the photoelectric conversion element. In traditional existing processes, even though a great effort is spent in these aspects, the ideal effect cannot be achieved due to the fact that the process limit has been reached. Therefore, a new image sensor and a corresponding process are needed to further reduce the dark current, noise, white spots, dark spots and other indexes.

Fourth, in the existing pixel, as each transistor is of a planar structure, parasitic capacitance among the transfer transistor, the reset transistor and the source follower transistor cannot be further reduced along with size reduction. The parasitic capacitance basically plays a negative role, for example, reducing a signal transmission rate, increasing low-frequency 1/f noise, and reducing a dynamic range, which are not acceptable by the image sensor. Therefore, the parasitic capacitance needs to be further reduced to reduce the low-frequency 1/f noise, so as to increase the signal transmission rate and the dynamic range, and this is a very tough and expensive task for the existing image sensor and the forming process thereof.

The Chinese patent application 201410193016.9 discloses an image sensor and a forming method thereof and provides a three-dimensional image sensor structure. A channel region of a source follower transistor is of a beam structure having a top surface and two side surfaces. A gate of the source follower transistor covers the top surface and at least one of the two side surfaces. In the application, process steps for forming the gate of the source follower transistor are difficult to achieve, so that performance of a semiconductor interface is affected. Therefore, how to form a gate with a good interface in a three-dimensional image sensor to improve performance of the image sensor becomes an urgent issue to be solved.

SUMMARY

In order to improve performance of an image sensor, and solve the problem that a gate of a transistor is difficult to be formed in a manufacturing process of a 3D image sensor, embodiments of the present disclosure provide a method for forming a backside illuminated image sensor with a three-dimensional transistor structure, wherein forming a gate of the three-dimensional transistor structure includes: forming a source follower transistor and/or a reset transistor with a three-dimensional transistor structure, wherein the source follower transistor and/or the reset transistor correspond to a protruding structure; and forming an insulating sidewall around the protruding structure, forming a groove between the insulating sidewall and a channel region of a transistor corresponding to the protruding structure, and forming a gate of the transistor in the groove, wherein the gate of the transistor is isolated by the insulating sidewall.

Optionally, the method may further include: forming a floating diffusion region in the protruding structure which is a portion of a semiconductor substrate; and forming a sidewall of the floating diffusion region during the formation of the insulating sidewall, wherein the floating diffusion region and a gate of a transfer transistor are isolated from each other through the sidewall of the floating diffusion region, to reduce parasitic capacitance.

Optionally, a surface of a portion of the semiconductor which corresponds to a photo diode is at least 100 nm lower than a surface of a portion of the semiconductor which corresponds to the floating diffusion region.

Optionally, the method may further include: forming shallow trench isolation structures, wherein the photo diode is disposed at the bottom of the shallow trench isolation structures, and the protruding structure between the shallow trench isolation structures corresponds to at least one of the source follower transistor, the reset transistor and the floating diffusion region; forming a dielectric layer to fill the shallow trench isolation structures; and etching a portion of the dielectric layer to form a groove to expose a corresponding region where a channel region of the source follower transistor and/or the reset transistor is disposed.

Optionally, silicon nitride is formed on the protruding structure to serve as a hard mask in self-aligned etching during the formation of the groove.

Optionally, the method may further include: following forming the groove, removing the dielectric layer by etching to expose a portion of the substrate over the photo diode, and forming the insulating sidewall; forming a gate oxide layer and a polycrystalline silicon layer to cover surfaces of the protruding structure, the groove and the insulating sidewall; and etching the polycrystalline silicon layer to form a gate of the three-dimensional transistor structure, wherein the insulating sidewall has a self-aligning effect in the etching and isolates the gate formed by the etching, to reduce a design size.

Optionally, the method may further include: following forming the gate oxide layer and the polycrystalline silicon layer, forming an anti-reflection layer and a light blocking layer.

Embodiments of the present disclosure further provide a backside illuminated image sensor with a three-dimensional transistor structure, including: a source follower transistor and/or a reset transistor with a three-dimensional transistor structure, wherein the source follower transistor and/or the reset transistor correspond to a protruding structure; and an insulating sidewall around the protruding structure, wherein a groove is disposed between the insulating sidewall and a channel region of a transistor corresponding to the protruding structure, and a gate of the transistor is disposed in the groove and isolated by the insulating sidewall.

Optionally, a floating diffusion region is disposed in the protruding structure which is a portion of a semiconductor substrate, and the floating diffusion region and a gate of a transfer transistor are isolated from each other through a sidewall of the floating diffusion region, to reduce parasitic capacitance.

Optionally, a surface of a portion of the semiconductor which corresponds to a photo diode is at least 100 nm lower than a surface of a portion of the semiconductor which corresponds to the floating diffusion region.

In embodiments of the present disclosure, an extra area needed by a shallow trench isolation structure in the existing device is reduced. Under a same size of pixels, a filling ratio of photosensitive device and a proportion of available light are improved. As the floating diffusion region and the photo diode are not on a same plane, compared with a traditional planar structure, junction capacitance of the floating diffusion region and parasitic capacitance between the floating diffusion region and the transfer transistor are smaller, and a conversion gain is greater. A structure of a Finfet transistor may ensure effective channel length and width of the transistor to be larger under the condition of the same area, especially the width of the channel. Besides, the structure of the Finfet transistor may greatly improve transconductance of the transistor, and 1/f noise can be reduced theoretically. Moreover, as the width of the protruding structure is reduced, a channel current tends to flow in bulk silicon away from a gate oxygen interface, so that noise caused by defects in the gate oxygen interface is avoided. In embodiments of the present disclosure, photoetching is performed twice to form the insulating sidewall around the groove. Processes are better controlled during the formation of the gate of the transistor, so that a shape and an interface of the gate are better.

BRIEF DESCRIPTION OF THE DRAWINGS

Other features and advantages of the present disclosure will become apparent or be described more specifically through accompanying drawings and following embodiments which are used to describe certain principles of the present disclosure with reference to the accompanying drawings.

DETAILED DESCRIPTION

In the existing image sensor, each transistor (e.g., a source follower transistor, a transfer transistor or a reset transistor) is always of a planar structure. Therefore, the corresponding pixel has many defects, for example, the chip area of the image sensor is difficult to be further reduced, the cost of the image sensor is relatively high, and the quality of images formed by the image sensor is difficult to be further improved, the noise level of the image sensor is difficult to be reduced, and a proportion of the area of the photoelectric conversion element in the pixel is difficult to be improved.

In the existing image sensor or the process design of applying the 3D transistor to the image sensor, polycrystalline silicon etching for forming a gate of a transistor is difficult to control during a forming process of the gate, which results in poor performance and interface of the formed gate.

Embodiments of the present disclosure provide a method for forming a backside illuminated image sensor with a three-dimensional transistor structure, wherein forming a gate of the three-dimensional transistor structure includes: forming a source follower transistor and/or a reset transistor with a three-dimensional transistor structure, wherein the source follower transistor and/or the reset transistor correspond to a protruding structure; and forming an insulating sidewall around the protruding structure, forming a groove between the insulating sidewall and a channel region of a transistor corresponding to the protruding structure, and forming a gate of the transistor in the groove, wherein the gate of the transistor is isolated by the insulating sidewall.

Figure 1:
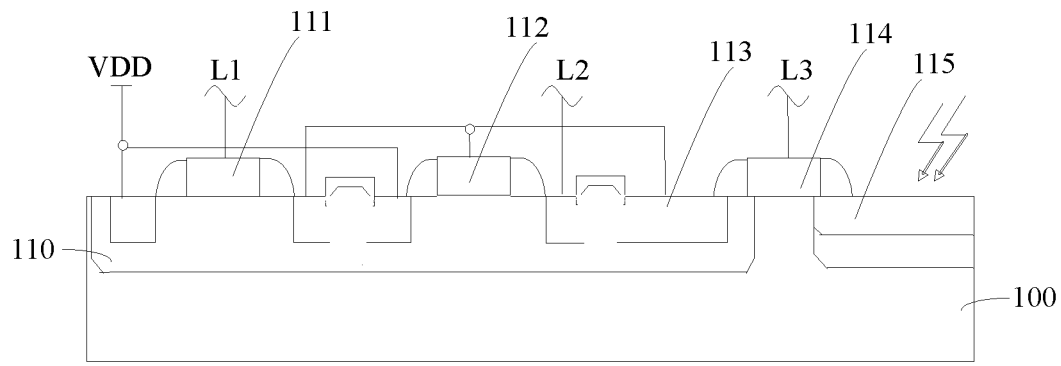
FIG. 1 schematically illustrates a cross-sectional view of a pixel in an existing image sensor.
Figure 2:
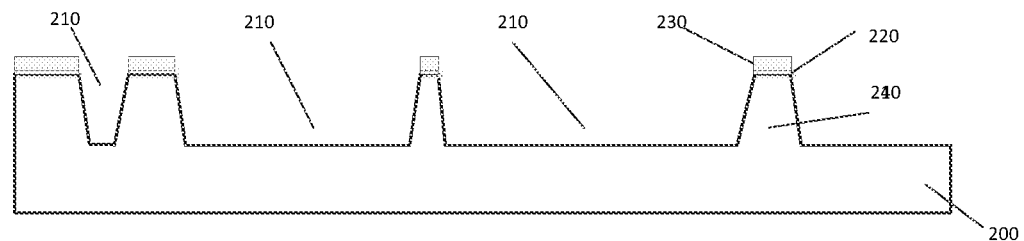
FIGS. 2 to 9 schematically illustrate intermediate structural diagrams of steps in a method for forming a backside illuminated image sensor with a three-dimensional transistor structure according to an embodiment.
Figure 3:
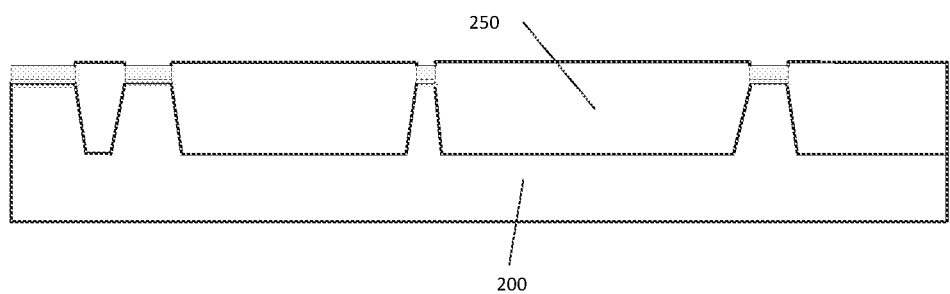
Figure 4:
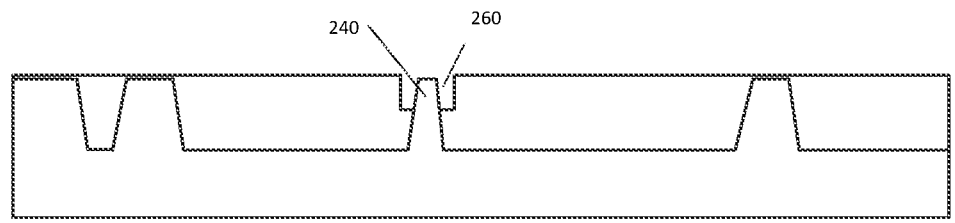
Figure 5:
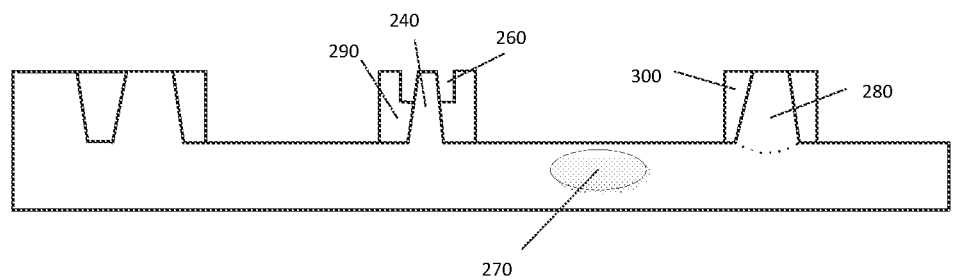
Figure 6:
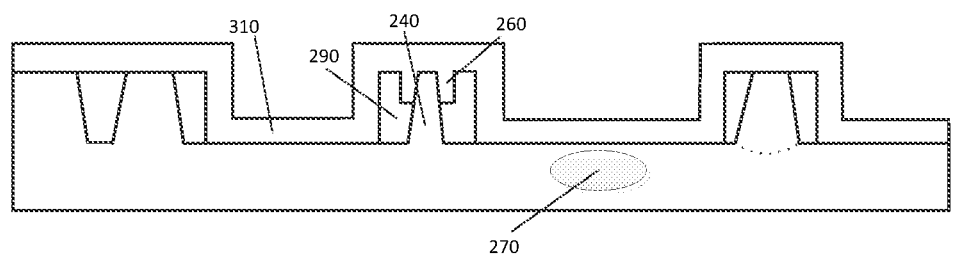
Figure 7:
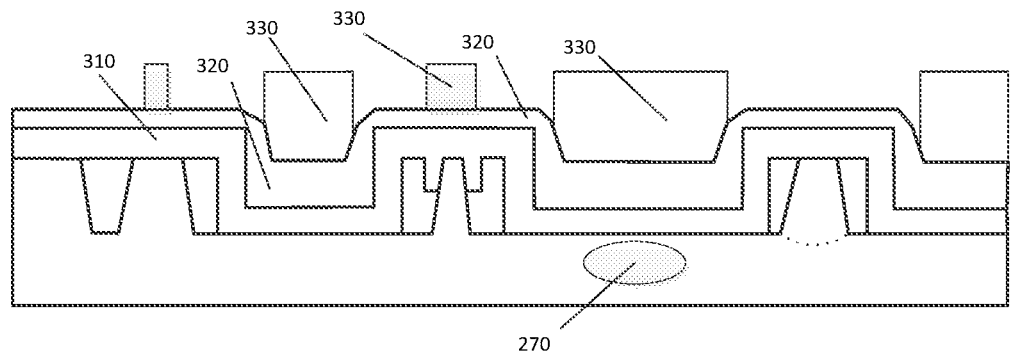
Figure 8:
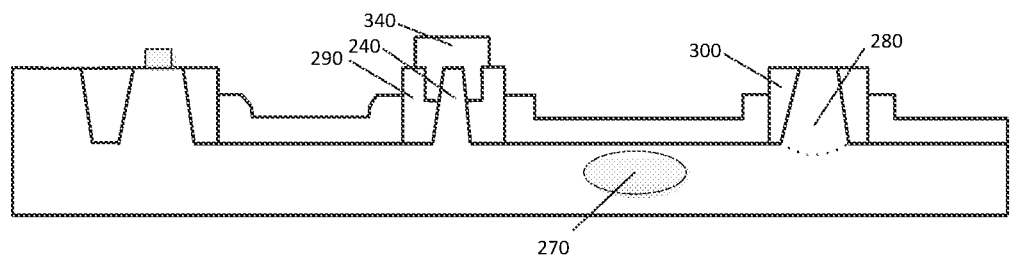
Figure 9:
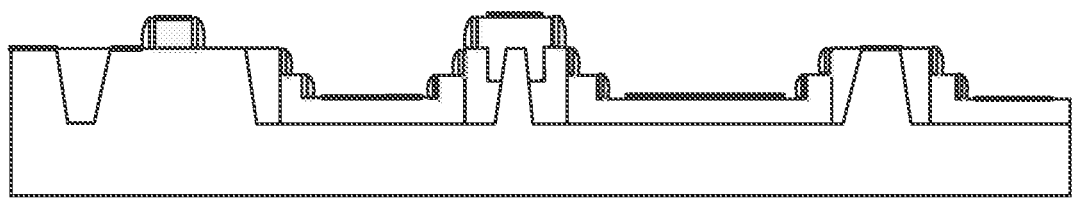

Solutions of the present disclosure are described in detail in conjunction with embodiments below. Referring to FIGS. 2 to 9, FIGS. 2 to 9 schematically illustrate intermediate structural diagrams of steps in a method for forming a backside illuminated image sensor with a three-dimensional transistor structure according to an embodiment. Referring to FIG. 2, a semiconductor substrate 200 is provided. The semiconductor substrate 200 is a carrier for manufacturing the image sensor and may be a silicon wafer. A pixel area and a logic area are defined. Silicon nitride 220 and photoresist 230 are formed on a surface of the semiconductor substrate 200, and etched to form a plurality of Shallow Trench Isolation (STI) structures 210 and a plurality of protruding structures 240 between the STI structures 210. Referring to FIG. 3, a dielectric layer 250 is filled in the STI structures 210, and a Chemical Mechanical Polishing (CMP) is performed. Referring to FIG. 4, a photoetching process is performed to expose a region where a reset transistor and/or a source follower transistor need to be formed. It should be noted that, both the reset transistor and the source follower transistor may be arranged around the protruding structure 240, or one of the reset transistor and the source follower transistor may be arranged around the protruding structures 240. After the photoetching process, the silicon nitride 220 may be selected as a hard mask to etch the dielectric layer 250, wherein the dielectric layer 250 is an insulating dielectric layer including silicon oxide, silicon oxynitride or the like. After the etching, the silicon nitride 220 is removed, and a groove 260 is formed around the protruding structure 240. The silicon nitride 220 is a hard mask in self-aligned etching during a process for forming the groove 260. Referring to FIG. 5, a portion of the dielectric layer 250 is etched again to remove the portion of the dielectric layer over a photo diode 270 to be formed subsequently to expose the surface of the semiconductor substrate 200, where a portion of the dielectric layer 250 is reserved around the protruding structure 240 where a floating diffusion region 280 is to be formed subsequently. An insulating sidewall 290 is formed around the protruding structure 240 corresponding to the source follower transistor and/or the reset transistor, the groove 260 is disposed between the insulating sidewall 290 and a channel region of the transistor corresponding to the protruding structure 240, and a sidewall 300 of the floating diffusion region 280 is formed at the same time with the formation of the insulating sidewall 290. Referring to FIG. 6, after ion injection or diffusion is performed to the source follower transistor and/or the reset transistor, a gate oxide layer (not labeled) is formed to cover surfaces of the protruding structures 240, the groove 260, the floating diffusion region 280, the insulating sidewall 290 and the sidewall 300, and a polycrystalline silicon layer 310 is formed to cover the gate oxide layer (not labeled). Referring to FIG. 7, the polysilicon layer 310 is etched. Optionally, a bottom anti-reflection coating (BARC) 320 is formed on the polysilicon layer 310 to planarize the pixel area. A light blocking layer 330 is formed on a surface of the anti-reflection layer 320. During the formation of the anti-reflection layer 320, a portion of the anti-reflection layer 320 above the photo diode 270 and closer to the insulating side wall 290 is thicker than other portions of the anti-reflection layer 320. Referring to FIG. 8, a polysilicon etching process is performed to make a gate 340 of the transistor be formed in the groove 260 and isolated by the insulating sidewall 290 which has a self-aligning effect in the etching process, which may further reduce a design size. The floating diffusion region 280 and a gate of a transfer transistor (not labeled) are isolated from each other through the sidewall 300 of the floating diffusion region 280, so that parasitic capacitance may be reduced, and performance of the image sensor may be improved. In some embodiments, the floating diffusion region is formed in a region corresponding to a protruding structure. A surface of a portion of the semiconductor which corresponds to the floating diffusion region 280 is at least 100 nm higher than a surface of a portion of the semiconductor which corresponds to the photo diode 270. Referring to FIG. 9, other elements of the image sensor device are formed by adopting an existing process, to finally form the backside illuminated image sensor with the three-dimensional transistor structure.

Figure 10:
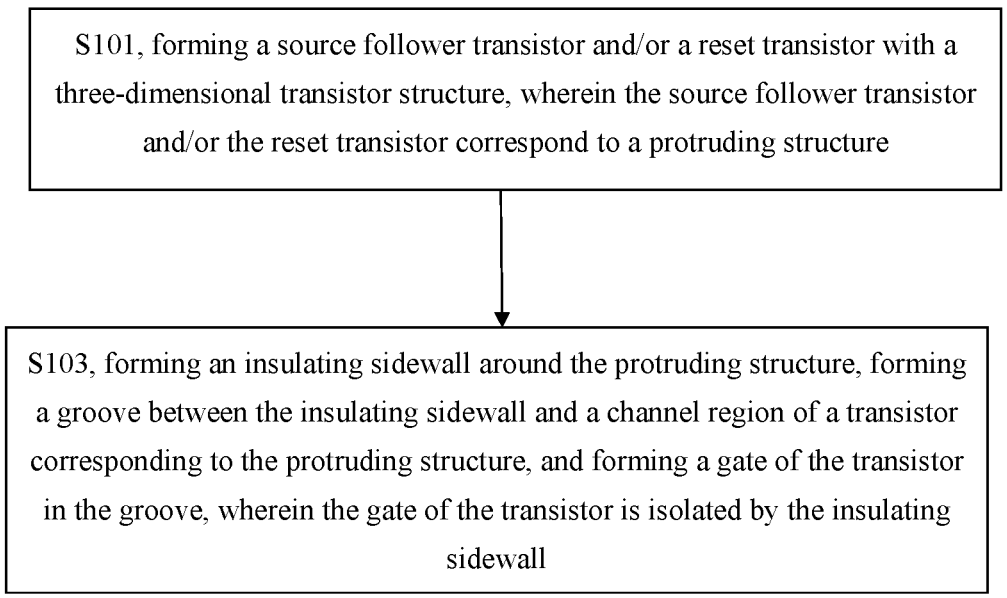
FIG. 10 schematically illustrates a flow chart of a method for forming a backside illuminated image sensor with a three-dimensional transistor structure according to an embodiment.

Referring to FIG. 10, FIG. 10 schematically illustrates a flow chart of a method for forming a backside illuminated image sensor with a three-dimensional transistor structure according to an embodiment. The method includes: S101, forming a source follower transistor and/or a reset transistor with a three-dimensional transistor structure, wherein the source follower transistor and/or the reset transistor correspond to a protruding structure; and S103, forming an insulating sidewall around the protruding structure, forming a groove between the insulating sidewall and a channel region of a transistor corresponding to the protruding structure, and forming a gate of the transistor in the groove, wherein the gate of the transistor is isolated by the insulating sidewall.

In embodiments of the present disclosure, an extra area needed by a shallow trench isolation structure in the existing device is reduced. Under a same size of pixels, a filling ratio of photosensitive device and a proportion of available light are improved. As the floating diffusion region and the photo diode are not on a same plane, compared with a traditional planar structure, junction capacitance of the floating diffusion region and parasitic capacitance between the floating diffusion region and the transfer transistor are smaller, and a conversion gain is greater. A structure of a Finfet transistor may ensure effective channel length and width of the transistor to be larger under the condition of the same area, especially the width of the channel. Besides, the structure of the Finfet transistor may greatly improve transconductance of the transistor, and 1/f noise can be reduced theoretically. Moreover, as the width of the protruding structure is reduced, a channel current tends to flow in bulk silicon away from a gate oxygen interface, so that noise caused by defects in the gate oxygen interface is avoided. In embodiments of the present disclosure, photoetching is performed twice to form the insulating sidewall around the groove. Processes are better controlled during the formation of the gate of the transistor, so that a shape and an interface of the gate are better.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A method for forming a backside illuminated image sensor with a three-dimensional transistor structure, wherein forming a gate of the three-dimensional transistor structure comprises:
    forming a source follower transistor and/or a reset transistor with a three-dimensional transistor structure, wherein the source follower transistor and/or the reset transistor correspond to a protruding structure;
    forming an insulating sidewall around the protruding structure, forming a groove between the insulating sidewall and a channel region of a transistor corresponding to the protruding structure, and forming a gate of the transistor in the groove, wherein the gate of the transistor is isolated by the insulating sidewall;
    forming a floating diffusion region in the protruding structure which is a portion of a semiconductor substrate; and
    forming a sidewall of the floating diffusion region during the formation of the insulating sidewall, wherein the floating diffusion region and a gate of a transfer transistor are isolated from each other through the sidewall of the floating diffusion region, to reduce parasitic capacitance.

2. The method according to claim 1, wherein a surface of a portion of the semiconductor which corresponds to a photo diode is at least 100 nm lower than a surface of a portion of the semiconductor which corresponds to the floating diffusion region.

3. The method according to claim 2, further comprising:
    forming shallow trench isolation structures, wherein the photo diode is disposed at the bottom of the shallow trench isolation structures, and the protruding structure between the shallow trench isolation structures corresponds to at least one of the source follower transistor, the reset transistor and the floating diffusion region;
    forming a dielectric layer to fill the shallow trench isolation structures; and
    etching a portion of the dielectric layer to form a groove to expose a corresponding region where a channel region of the source follower transistor and/or the reset transistor is disposed.

4. The method according to claim 3, wherein silicon nitride is formed on the protruding structure to serve as a hard mask in self-aligned etching during the formation of the groove.

5. The method according to claim 3, further comprising:
    following forming the groove, removing the dielectric layer by etching to expose a portion of the substrate over the photo diode, and forming the insulating sidewall;
    forming a gate oxide layer and a polycrystalline silicon layer to cover surfaces of the protruding structure, the groove and the insulating sidewall; and
    etching the polycrystalline silicon layer to form a gate of the three-dimensional transistor structure, wherein the insulating sidewall has a self-aligning effect in the etching and isolates the gate formed by the etching, to reduce a design size.

6. The method according to claim 5, further comprising:
following forming the gate oxide layer and the polycrystalline silicon layer, forming an anti-reflection layer and a light blocking layer.

7. A backside illuminated image sensor with a three-dimensional transistor structure, comprising:
a source follower transistor and/or a reset transistor with a three-dimensional transistor structure, wherein the source follower transistor and/or the reset transistor correspond to a protruding structure; and
an insulating sidewall around the protruding structure, wherein a groove is disposed between the insulating sidewall and a channel region of a transistor corresponding to the protruding structure, and a gate of the transistor is disposed in the groove and isolated by the insulating sidewall;
wherein a floating diffusion region is disposed in the protruding structure which is a portion of a semiconductor substrate, and the floating diffusion region and a gate of a transfer transistor are isolated from each other through a sidewall of the floating diffusion region, to reduce parasitic capacitance.

8. The backside illuminated image sensor according to claim 7, wherein a surface of a portion of the semiconductor which corresponds to a photo diode is at least 100 nm lower than a surface of a portion of the semiconductor which corresponds to the floating diffusion region.

\* \* \* \* \*